(12) United States Patent
Kunishima et al.

(10) Patent No.: US 8,044,720 B2
(45) Date of Patent: Oct. 25, 2011

(54) AMPLIFICATION CIRCUIT

(75) Inventors: Tsutomu Kunishima, Miyagi-Ken (JP); Akira Takayama, Miyagi-Ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 0 days.

(21) Appl. No.: 12/725,086

(22) Filed: Mar. 16, 2010

(65) Prior Publication Data

US 2010/0231302 A1    Sep. 16, 2010

(30) Foreign Application Priority Data

Mar. 16, 2009  (JP) ................. 2009-062271

(51) Int. Cl.
*H03F 3/45*  (2006.01)
(52) U.S. Cl. ...................... 330/254; 330/260
(58) Field of Classification Search ............ 330/86, 330/254, 260, 278, 279, 282
See application file for complete search history.

(56) References Cited

U.S. PATENT DOCUMENTS

| | | | |
|---|---|---|---|
| 7,332,963 B2 * | 2/2008 | Pelleriti | 330/254 |
| 7,592,869 B2 * | 9/2009 | Bae et al. | 330/254 |
| 7,679,446 B2 * | 3/2010 | Kim et al. | 330/282 |

FOREIGN PATENT DOCUMENTS

| | | |
|---|---|---|
| JP | 09-270643 | 10/1997 |
| JP | 2002-164748 | 6/2002 |

\* cited by examiner

*Primary Examiner* — Khanh Nguyen
(74) *Attorney, Agent, or Firm* — Brinks Hofer Gilson & Lione

(57) ABSTRACT

An amplification circuit includes a semiconductor amplification element, a current feedback circuit that is connected to a terminal close to a ground side of the semiconductor amplification element and can control gain reduction, and a voltage feedback circuit that is connected between an input terminal and an output terminal of the semiconductor amplification element and can control feedback voltage. The feedback voltage of the voltage feedback circuit may be varied according to the gain reduction controlled by the current feedback circuit.

7 Claims, 4 Drawing Sheets

AMPLIFICATION CIRCUIT

CROSS REFERENCE TO RELATED APPLICATION

The present application contains subject matter related to and claims priority to Japanese Patent Application No. 2009-062271 filed in the Japanese Patent Office on Mar. 16, 2009, the entire contents of which being incorporated herein by reference.

BACKGROUND

1. Technical Field

The present invention relates to an amplification circuit amplifying a high-frequency signal.

2. Related Art

In known amplification circuit amplifying a high-frequency signal, a circuit that controls current feedback by varying resistance of a source of an FET is a semiconductor amplification element. For example, such an amplification circuit is disclosed in Japanese Unexamined Patent Application Publication No. 9-270643. As shown in FIG. 3, the amplification circuit includes a pair of amplifying FETs 42 and 43 to which input signals are input, a current feedback circuit 45 provided between sources of the pair of amplifying FETs 42 and 43, and voltage feedback circuits 46 and 47 provided between drains and gates of the amplifying FETs 42 and 43. Constant current circuits 48 and 49 are connected between the ground and the sources of the amplifying FETs 42 and 43, and current flowing in the amplifying FETs 42 and 43 is constantly controlled by the constant current circuits 48 and 49.

The current feedback circuit 45 is configured by subsequently connecting, in three stages, a plurality of serial circuits in which two fixed resistors and a switching FET are serially connected. Gates of switching FETs 51, 52, and 53 of the serial circuits are connected to a control circuit 55. Any one of the switching FETs 51, 52, and 53 is turned on by a control of the control circuit 55, and thus a plurality of fixed resistors R21 to R26 is selectively connected in series, thereby varying a resistance value of current feedback resistors of the pair of amplifying FETs 42 and 43.

The voltage feedback circuits 46 and 47 include fixed resistors R27 and R28 provided between the drains and the gates of the amplifying FETs 42 and 43, respectively, and negatively feed a part of output signals back to the input side through the fixed resistors R27 and R28. In the amplification circuit, the resistance of the current feedback circuit 45 is controlled to vary gain reduction, a part of the output signals in the voltage feedback circuits 46 and 47 are negatively fed back to the input side, and thus a gain characteristic is flat with respect to frequency of the output signals.

However, the amplification circuit 41 has a problem that input impedance increases and thus return loss of input signals deteriorates, when gain reduction is to be increased as shown in FIG. 4. Thus, it is difficult to widen the range of amplification rates by increasing gain reduction.

SUMMARY

An amplification circuit includes: a semiconductor amplification element; a current feedback circuit that is connected to a terminal close to a ground side of the semiconductor amplification element and can control gain reduction; and a voltage feedback circuit that is connected between an input terminal and an output terminal of the semiconductor amplification element and can control feedback voltage, wherein the feedback voltage of the voltage feedback circuit may be varied according to the gain reduction controlled by the current feedback circuit.

With such a configuration, since the feedback voltage of the voltage feedback circuit may be varied according to the gain reduction controlled by the current feedback circuit, it is possible to suppress the increase of input impedance by increasing the feedback voltage when the gain reduction is increased. Accordingly, when the gain reduction is increased, it is possible to suppress return loss of input signals caused by the increase of the input impedance.

DESCRIPTION OF EXEMPLARY EMBODIMENTS

Figure 1:
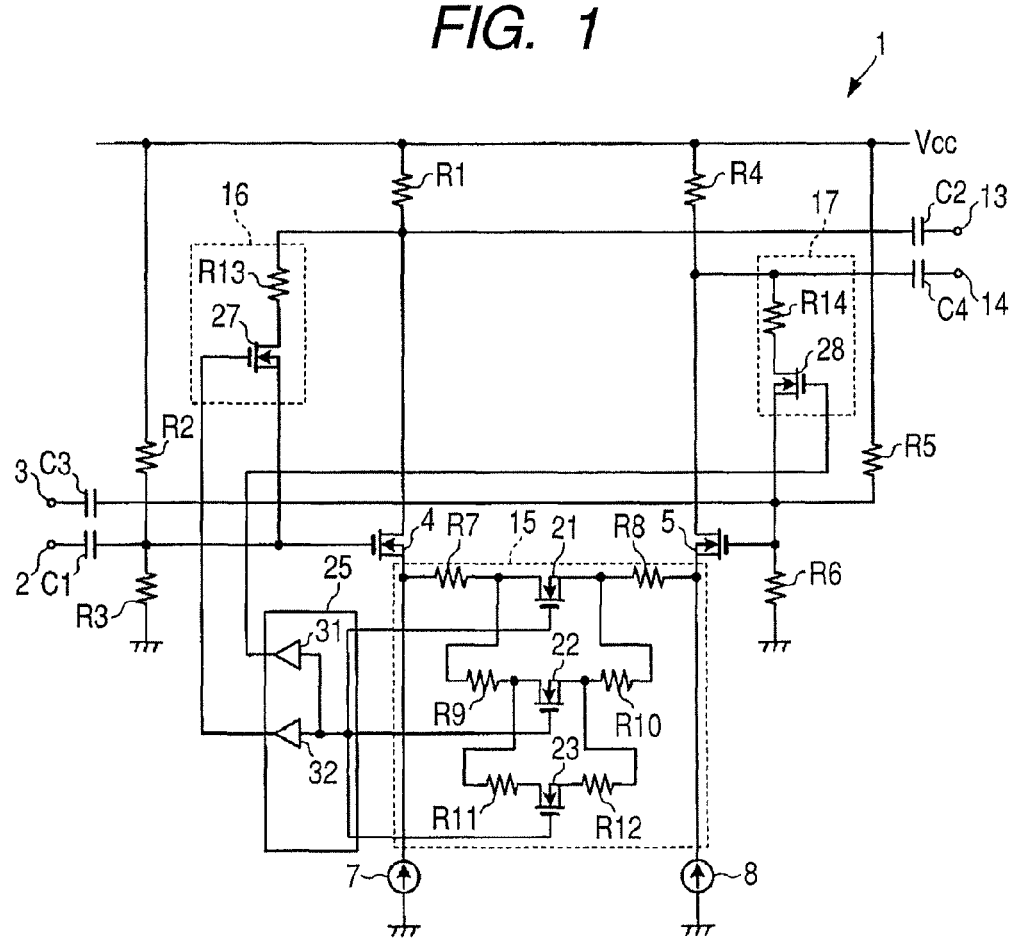
FIG. 1 is a circuit diagram illustrating a differential amplification circuit of an amplification circuit according to an embodiment of the invention.

Hereinafter, an embodiment of the invention will be described with reference to the accompanying drawings. In the following description, a configuration of applying the invention to a differential amplification circuit is described by way of example, but the invention can be applied to an amplification circuit with the other configuration. FIG. 1 is a circuit diagram illustrating a differential amplification circuit according to the embodiment of the invention.

As shown in FIG. 1, a differential amplification circuit 1 amplifies the input signal according to difference between the two input signals, and is formed to include a pair of amplifying FETs 4 and 5. A gate of the amplifying FET 4 is connected to an input terminal 2 through a capacitor C1 which is used for cutting direct current, and a source thereof is connected to the ground through a constant current circuit 7. A drain of the amplifying FET 4 is connected to an output terminal 13 through a capacitor C2 which is used for cutting direct current.

The drain of the amplifying FET 4 is connected to a power supply Vcc through a fixed resistor R1. The power supply Vcc is connected to the gate of the amplifying FET 4 through a fixed resistor R2. A fixed resistor R3 is connected between the connection point of the fixed resistor R2 and the amplifying FET 4 and the ground, and a gate voltage output from the power supply Vcc is divided by the fixed resistor R2 and the fixed resistor R3 and is applied to the gate of the amplifying FET 4.

Similarly, a gate of the amplifying FET 5 is connected to an input terminal 3 through a capacitor C3, a source thereof is connected to the ground through a constant current circuit 8, and a drain thereof is connected to an output terminal 14 through a capacitor C4. The drain of the amplifying FET 5 is connected to the power supply Vcc through a fixed resistor R4. The power supply Vcc is connected to the gate of the amplifying FET 5 through a fixed resistor R5, and a fixed resistor R6 is connected between the connection point of the fixed resistor R5 and the amplifying FET 5 and the ground.

The gate voltage output from the power supply Vcc is divided by the fixed resistor R5 and the fixed resistor R6, and is applied to the gate of the amplifying FET 5.

The constant current circuits 7 and 8 constantly control current flowing in the pair of amplifying FETs 4 and 5.

A current feedback circuit 15 is connected between the sources of the pair of amplifying FETs 4 and 5. The current feedback circuit 15 is configured by subsequently connecting, in three stages, serial circuits in which two fixed resistors and a switching FET are connected in series. In the current feedback circuit 15, a drain of a first switching FET 21 is connected to the source of the amplifying FET 4 through a fixed resistor R7, and a source thereof is connected to the source of the amplifying FET 5 through a fixed resistor R8.

A drain of a second switching FET 22 is connected to the source of the amplifying FET 4 through the fixed resistor R7 and a fixed resistor R9, and a source thereof is connected to the source of the amplifying FET 5 through the fixed resistor R8 and a fixed resistor R10. A drain of a third switching FET 23 is connected to the source of the amplifying FET 4 through the fixed resistor R7, the fixed resistor R9, and a fixed resistor R11, and a source thereof is connected to the source of the amplifying FET 5 through the fixed resistor R8, the fixed resistor R10, and a fixed resistor R12.

The gates of the switching FETs 21, 22, and 23 are connected to a control circuit 25, and are turned on or off by a control of the control circuit 25. A resistance value of the current feedback circuit 15 may be varied by the on-off switching of the switching FETs 21, 22, and 23 controlled by the control circuit 25.

For example, when the first switching FET 21 is turned on and the second and third switching FETs 22 and 23 are turned off, a resultant resistance of the fixed resistors R7 and R8 is a resistance value of the current feedback circuit 15. When the first and second switching FETs 21 and 22 are turned off and the second switching FET 22 is turned on, a resultant resistance of the fixed resistors R7 to R12 is a resistance value of the current feedback circuit 15.

As described above, the resistance value of the current feedback circuit 15 is varied to control the feedback current of the amplifying FETs 4 and 5, and thus an amplification rate of the input signals may be varied. In this case, when the resistance value of the current feedback circuit 15 is increased, the feedback current of the pair of amplifying FETs 4 and 5 is increased. That is, gain reduction is increased. In this case, since the resistance value of the current feedback circuit 15 is increased, input impedance is increased.

When the resistance value of the current feedback circuit 15 is decreased, the feedback current of the pair of amplifying FETs 4 and 5 is decreased. That is, the gain reduction is decreased. In this case, since the resistance value of the current feedback circuit 15 is decreased, the input impedance is decreased.

A voltage feedback circuit 16 including a fixed resistor R13 and a variable resistance FET 27 is connected between the drain and the gate of the amplifying FET 4. One end of the fixed resistor R13 is connected to the drain of the amplifying FET 4, and the other end is connected to a drain of the variable resistance FET 27. A source of the variable resistance FET 27 is connected to the gate of the amplifying FET 4, and a gate thereof is connected to the control circuit 25.

A resistance value between the drain and the source of the variable resistance FET 27 may be varied according to gate voltage applied from the control circuit 25. When the gate voltage is high, the resistance value decreases. When the gate voltage is low, the resistance value increases. The feedback voltage to the input side of the amplifying FET 4 is controlled by varying the resistance value between the drain and the source of the variable resistance FET 27.

Similarly, a voltage feedback circuit 17 including a fixed resistor R14 and a variable resistance FET 28 is connected between the drain and the gate of the amplifying FET 5. A resistance value between a drain and a source of the variable resistance FET 28 may be varied according to gate voltage applied from the control circuit 25 to the variable resistance FET 28, thereby controlling the feedback voltage to the input side of the amplifying FET 5. As described above, by controlling the feedback voltage which is negatively fed back to the input sides of the pair of amplifying FETs 4 and 5 by the voltage feedback circuits 16 and 17, the increase of the input impedance is suppressed.

The control circuit 25 controls the gain reduction by controlling the resistance of the current feedback circuit 15, and controls the feedback voltage by controlling the resistance values of the voltage feedback circuits 16 and 17 according to the gain reduction. The control circuit 25 includes inverse output portions 31 and 32, controls the feedback voltage so that it increases as the gain reduction is increased, and controls the feedback voltage so that it decreases as the gain reduction is decreased.

Figure 2:
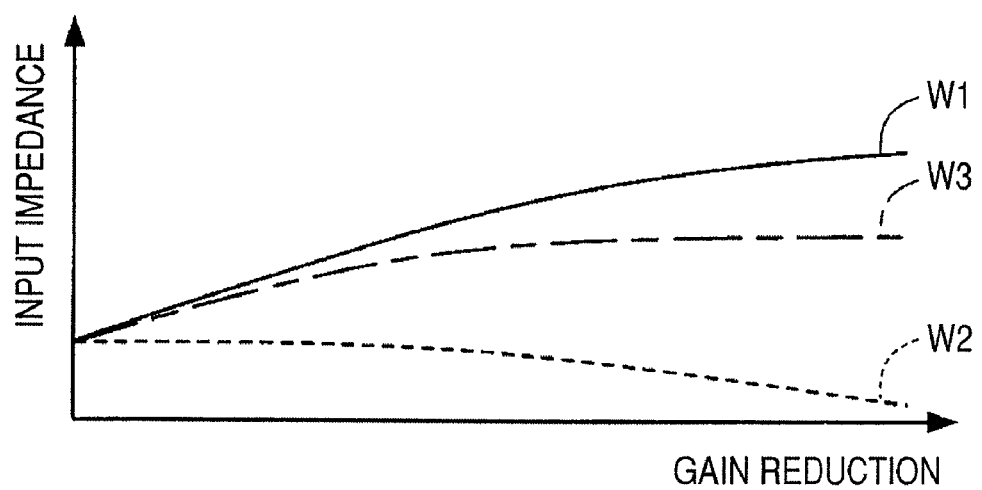
FIG. 2 is a diagram illustrating a relationship between gain reduction and input impedance in the amplification circuit according to the embodiment of the invention.
Figure 3:
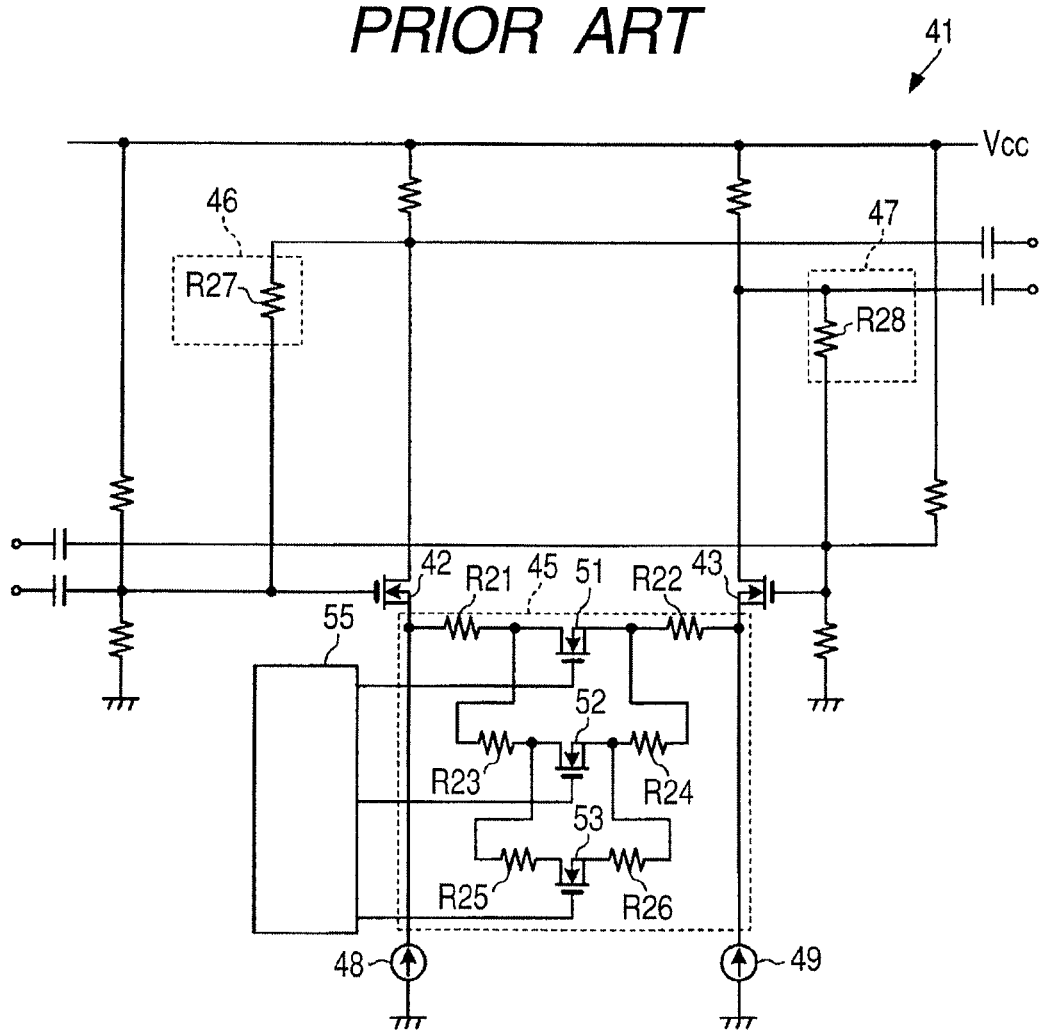
FIG. 3 is a circuit diagram illustrating the known differential amplification circuit.
Figure 4:
FIG. 4 is a diagram illustrating a relationship between gain reduction and input impedance in the known differential amplification circuit.

Hereinafter, a control process performed by the control circuit will be described with reference to FIG. 2. FIG. 2 is a diagram illustrating a relationship between gain reduction and input impedance. In FIG. 2, the horizontal axis denotes gain reduction, and the vertical axis denotes input impedance. The solid line W1 shown in FIG. 2 denotes an impedance characteristic of the current feedback circuit when the resistance value of the voltage feedback circuit is constant, and the dashed line W2 denotes an impedance characteristic of the voltage feedback circuit when the resistance value of the current feedback circuit is constant, and the chain line W3 denotes an impedance characteristic of the differential amplification circuit according to the embodiment.

As shown in FIG. 2 by the solid line W1, when the resistance values of the voltage feedback circuits 16 and 17 are constant, the input impedance is increased as the gain reduction is increased. On the other hand, as shown by the dashed line W2, when the resistance value of the current feedback circuit 15 is constant, the feedback voltage is increased and the input impedance is decreased as the gain reduction is increased. As described above, when the gain reduction is increased, the current feedback circuit 15 operates so as to increase the input impedance and the voltage feedback circuits 16 and 17 operate so as to decrease the input impedance.

The differential amplification circuit 1 according to the embodiment suppresses the increase of the input impedance caused by the increase of the gain reduction as shown by the chain line W3, using such characteristics of the current feedback circuit 15 and the voltage feedback circuit 16. Specifically, when the resistance value of the current feedback circuit 15 is controlled to be high, the control circuit 25 controls the resistance values of the voltage feedback circuits 16 and 17 to be low by increasing the gate voltages of the variable resistance FETs 27 and 28. Accordingly, even when the gain reduction is increased by increasing the resistance value of the current feedback circuit 15, the increase of the input impedance is suppressed since the feedback voltage to the input sides of the amplifying FETs 4 and 5 is increased by decreasing the resistance value of the voltage feedback circuit 16.

When the resistance value of the current feedback circuit 15 is controlled to be low, the control circuit 25 controls the resistance values of the voltage feedback circuits 16 and 17 to be high by decreasing the gate voltages of the variable resistance FETs 27 and 28. Accordingly, even when the gain reduction is decreased by decreasing the resistance value of the current feedback circuit 15, the input impedance is controlled so as to be flat since the feedback voltage to the input sides of the amplifying FETs 4 and 5 is decreased by increasing the resistance value of the voltage feedback circuit 16. Therefore, in the differential amplifying circuit 1, when the gain reduction is varied, the fluctuation of the input impedance is suppressed to be small and the return loss at the time of increasing the gain reduction is suppressed, using the contrary characteristics of the current feedback circuit 15 and the voltage feedback circuits 16 and 17.

As described above, according to the differential amplification circuit 1 of the embodiment, the feedback voltage of the voltage feedback circuits 16 and 17 may be varied according to the gain reduction by the current feedback circuit 15. Accordingly, it is possible to suppress the increase of the input impedance by increasing the feedback voltage when the gain reduction is increased. Therefore, when the gain reduction is increased, it is possible to suppress the return loss of the input signal caused by the increase of the input impedance.

In the embodiment, the semiconductor amplification element has been described as the FET, but the invention is not limited to this configuration. Any semiconductor amplification element used in the amplification may be used, for example, the semiconductor amplification element may be formed of a bipolar transistor.

In the embodiment, the switching element of the current feedback circuit has been described as the FET, but the invention is not limited to this configuration. Any switching element that can be turned on or off by the control circuit may be used, for example, the switching element may be formed of another transistor.

In the embodiment, the variable resistor of the voltage feedback circuit has been described as the FET, but the invention is not limited to this configuration. Any variable resistor with a resistance value that may be varied by the control circuit may be used, for example, the variable resistor may be formed of another transistor.

In the embodiment, the voltage feedback circuit is configured by serially connecting the fixed resistor to the FET, but the invention is not limited to this configuration. A configuration in which the feedback voltage of the voltage feedback circuit can be controlled may be applied, for example, it may be formed of only FET.

In the embodiment, the current feedback circuit is configured by subsequently connecting, in three stages, the serial circuits in which two fixed resistors are connected to the switching FET, but the invention is not limited to this configuration. A configuration in which the amplification rate can be controlled by the current feedback circuit may be applied, for example, it may be formed of a single variable resistor.

In the embodiment, the differential amplification is configured by connecting the current feedback circuit between the sources of two amplifying FETs, but the invention is not limited to this configuration. Any amplification circuit may be used, for example, a configuration in which the current feedback circuit is connected between the source of one amplifying FET and the ground.

As described above, the invention has an advantage capable of suppressing the return loss when the gain reduction is increased, and particularly, the invention is useful for an amplification circuit which amplifies high-frequency signals.

It should be understood by those skilled in the art that various modifications, combinations, sub-combinations and alterations may occur depending on design requirements and other factors insofar as they are within the scope of the appended claims of the equivalents thereof.

What is claimed is:

1. An amplification circuit comprising:
 a semiconductor amplification element;
 a current feedback circuit connected to a terminal close to a ground side of the semiconductor amplification element and can control gain reduction; and
 a voltage feedback circuit connected between an input terminal and an output terminal of the semiconductor amplification element and can control feedback voltage,
 wherein the feedback voltage of the voltage feedback circuit varies according to the gain reduction controlled by the current feedback circuit,
 wherein the feedback voltage of the voltage feedback circuit is increased as the gain reduction controlled by the current feedback circuit is increased,
 wherein the feedback voltage of the voltage feedback circuit is decreased as the gain reduction controlled by the current feedback circuit is decreased,
 wherein the current feedback circuit has a first resistance portion with a variable resistance value, and controls the gain reduction according to the resistance value of the first resistance portion,
 wherein the voltage feedback circuit has a second resistance portion with a variable resistance value and controls the feedback voltage according to the resistance value of the second resistance portion,
 wherein the resistance value of the second resistance portion is decreased when the resistance value of the first resistance portion is increased, and
 wherein the resistance value of the second resistance portion is increased when the resistance value of the first resistance portion is decreased.

2. The amplification circuit according to claim 1, wherein the first resistance portion has a plurality of serial connection circuits in which a fixed resistor and a switching element are connected in series, and the plurality of serial connection circuits are subsequently connected in multiple stages, and
 wherein the resistance value of the first resistance portion may be varied by turning on or off the switching elements of the plurality of serial connection circuits.

3. The amplification circuit according to claim 1, wherein the second resistance portion has a variable-resistor transistor, and
 wherein the resistance value of the second resistance portion may be varied by controlling voltage applied to a base or a gate of the variable-resistor transistor.

4. The amplification circuit according to claim 3, wherein the second resistance portion includes a serial connection circuit in which the variable-resistor transistor and a fixed resistor are connected in series.

5. The amplification circuit according to claim 1, wherein the semiconductor amplification element constitutes a differential amplification circuit including a pair of semiconductor amplification elements, and
 wherein the first resistance portion is connected between terminals close to the ground side of the pair of semiconductor amplification elements.

6. The amplification circuit according to claim 1, wherein one semiconductor amplification element is provided, and
 wherein the first resistance portion is connected between a terminal close to the ground side of the one semiconductor element and the ground.

7. The amplification circuit according to claim 1, wherein the semiconductor amplification element comprises an FET.

* * * * *